United States Patent
Oh et al.

(10) Patent No.: US 9,804,236 B2
(45) Date of Patent: Oct. 31, 2017

(54) MAGNETIC RESONANCE IMAGING APPARATUS AND METHOD OF GENERATING MAGNETIC RESONANCE IMAGE

(71) Applicant: Samsung Electronics Co., Ltd., Gyeonggi-do (KR)

(72) Inventors: Keum-yong Oh, Gyeonggi-do (KR); Su-jin Kim, Gyeonggi-do (KR); Sung-pil Jung, Gyeonggi-do (KR); Yang-lim Choi, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 142 days.

(21) Appl. No.: 14/960,572

(22) Filed: Dec. 7, 2015

(65) Prior Publication Data

US 2016/0163047 A1   Jun. 9, 2016

(30) Foreign Application Priority Data

Dec. 5, 2014   (KR) .................. 10-2014-0174286

(51) Int. Cl.
   *G06K 9/00*   (2006.01)
   *G01R 33/34*   (2006.01)
   *G01R 33/54*   (2006.01)
   *G01R 33/56*   (2006.01)

(52) U.S. Cl.
   CPC ........... *G01R 33/34* (2013.01); *G01R 33/543* (2013.01); *G01R 33/5608* (2013.01); *G01R 33/546* (2013.01)

(58) Field of Classification Search
   CPC ... G01R 33/34; G01R 33/543; G01R 33/5608
   See application file for complete search history.

(56) References Cited

U.S. PATENT DOCUMENTS

5,243,288 A *  9/1993  Mori ............... G01R 33/3415
                                                  324/314
8,325,037 B2   12/2012 Luemkemann et al.
9,075,102 B2 *  7/2015  Ham ..................... G01R 33/28
(Continued)

FOREIGN PATENT DOCUMENTS

JP   2009-165625 A   7/2009
JP   2013-75060 A    4/2013
(Continued)

OTHER PUBLICATIONS practiCal fMRI: the nuts & bolts, Physics for Understanding fMRI Artifacts: Part Eleven, Aug. 2011, pp. 1-8 http://practicalfmri.blogspot.kr/2011/08/physics-for-understanding-fmri_15.html.

COCIR Sustainable Competence in Advancing Healthcare, Self-Regulatory Initiative for Medical Imaging Equipment, Magnetic Resonance Measurement of Energy Consumption, Mar. 2012, pp. 1-13.

(Continued)

*Primary Examiner* — John Strege
(74) *Attorney, Agent, or Firm* — Cha & Reiter, LLC.

(57) ABSTRACT

A magnetic resonance imaging (MRI) apparatus and a method of generating an MR image that may be generated in a resource saving mode by taking into account energy efficiency. The method includes: setting a resource saving mode; acquiring, based on the set resource saving mode, at least one description corresponding to a plurality of imaging filters; and generating a first MR image based on the acquired at least one description.

26 Claims, 13 Drawing Sheets

(56) References Cited

U.S. PATENT DOCUMENTS

| | | | |
|---|---|---|---|
| 9,383,422 B2* | 7/2016 | Yokoi | G01R 33/34 |
| 9,606,207 B2* | 3/2017 | Hwang | G01R 33/54 |
| 2009/0182222 A1* | 7/2009 | Machida | G01R 33/482 |
| | | | 600/410 |
| 2011/0210739 A1* | 9/2011 | Ham | G01R 33/28 |
| | | | 324/318 |
| 2013/0300413 A1* | 11/2013 | Hwang | G01R 33/54 |
| | | | 324/309 |
| 2015/0117735 A1* | 4/2015 | Park | G01R 33/5611 |
| | | | 382/131 |
| 2015/0276905 A1* | 10/2015 | Murase | A61B 5/7203 |
| | | | 324/322 |
| 2016/0027153 A1* | 1/2016 | Eun | G06T 5/002 |
| | | | 382/131 |
| 2017/0003366 A1* | 1/2017 | Jafari-Lhouzani | G01R 33/5608 |

FOREIGN PATENT DOCUMENTS

| | | |
|---|---|---|
| JP | 2013-150717 A | 8/2013 |
| JP | 2015-173799 A | 10/2015 |

OTHER PUBLICATIONS

COCIR Sustainable Competence in Advancing Healthcare, Self-Regulatory Initiative for Medical Imaging Equipment, Magnetic Resonance Equipment Measurement of Energy Consumption, Jun. 2012, pp. 1-16.
Korean Notice of Allowance dated May 23, 2016.

\* cited by examiner

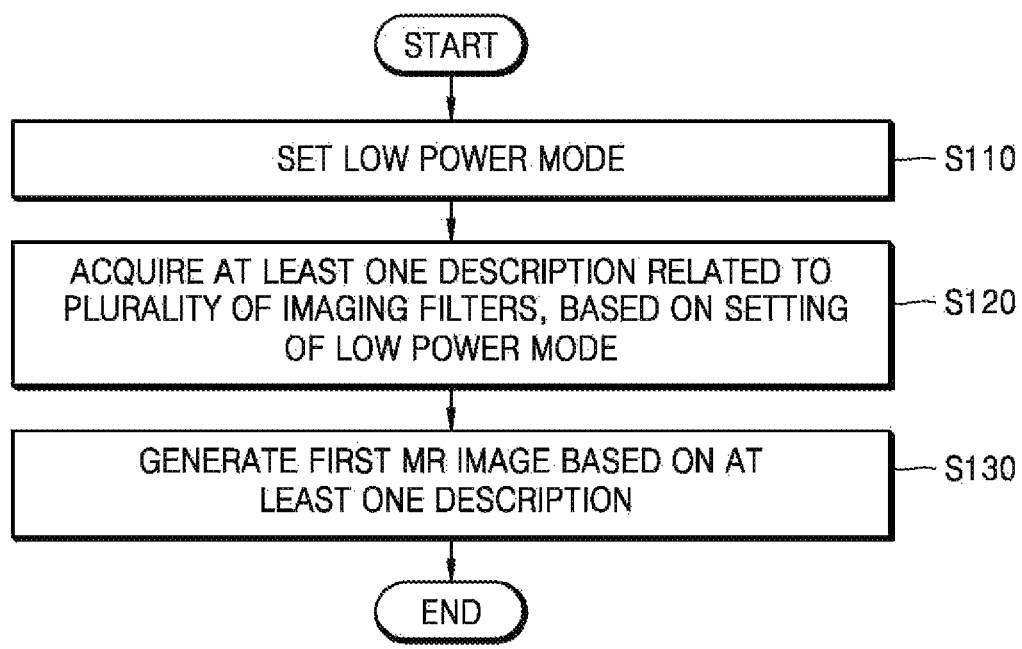

FIG. 7C
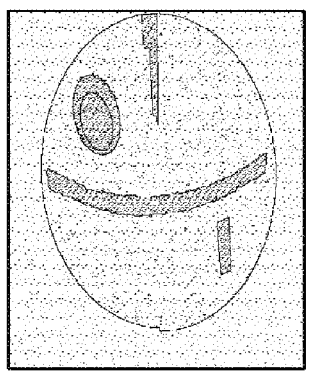
700-1
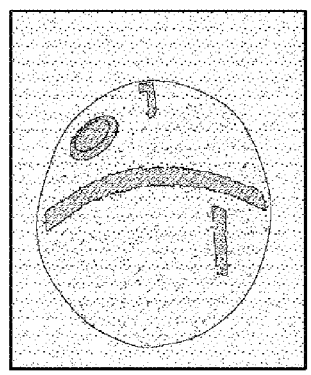
700-2
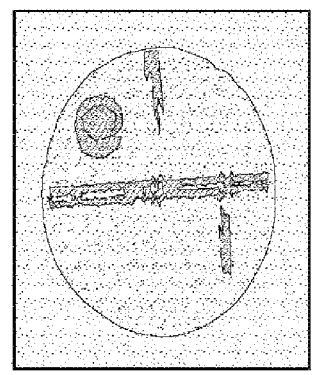
700-3

FIG. 9A
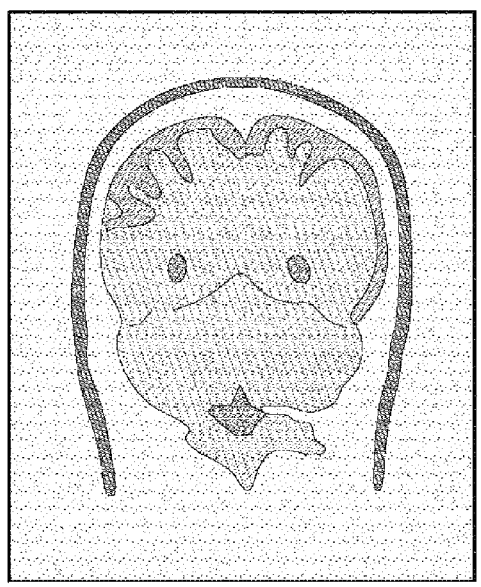
FIG. 9B
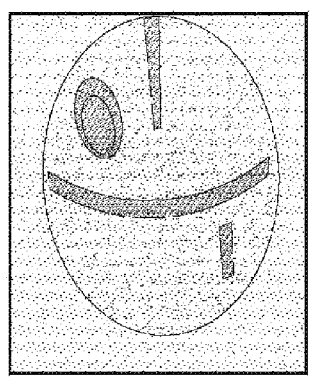
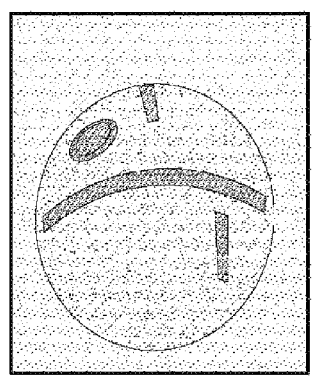
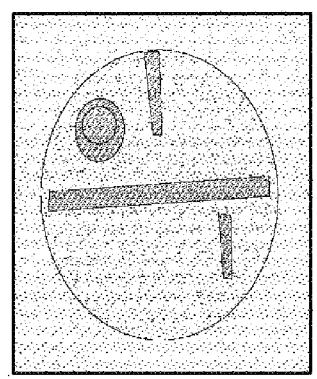
900-1              900-2              900-3

MAGNETIC RESONANCE IMAGING APPARATUS AND METHOD OF GENERATING MAGNETIC RESONANCE IMAGE

CLAIM OF PRIORITY

This application claims the benefit of priority from Korean Patent Application No. 10-2014-0174286, filed on Dec. 5, 2014, in the Korean Intellectual Property Office, the disclosure of which is incorporated herein in its entirety by reference.

BACKGROUND

1. Field of the Disclosure

The present disclosure relates to magnetic resonance imaging (MRI) apparatuses and methods of generating an MR image. More particularly, the present disclosure relates to an MRI apparatus and a method of generating an MR image whereby an MR image may be generated in a resource saving mode by taking into account energy efficiency.

2. Description of the Related Art

An MRI apparatus uses a magnetic field to capture an image of a target object. MRI apparatuses are widely used for the accurate diagnosis of diseases because they show stereoscopic images of bones, lumbar discs, joints, nerve ligaments, etc. at desired angles.

In addition, since an MRI apparatus requires a relatively large amounts of power and a large amounts of time to obtain an image, it is of paramount importance to efficiently manage power and scan time in the MRI apparatus.

SUMMARY

The present disclosure provides magnetic resonance imaging (MRI) apparatuses and methods of generating an MR image, whereby an MR image may be generated in a resource saving mode by taking into account energy efficiency in ways heretofore unknown.

Additional aspects regarding MRI apparatuses and methods will be set forth in part in the description which follows that will be understood by a person of ordinary skill in the art from reading the description, or may be learned by practice of the presented embodiments provided for illustrative purposes.

According to an aspect of an embodiment disclosed herein, a method of generating an MR image via an MRI apparatus includes: setting a resource saving mode; acquiring, based on the set resource saving mode, at least one description corresponding to a plurality of imaging filters; and generating a first MR image based on the acquired at least one description.

The setting of the resource saving mode may be based on at least one of the amount of power consumption of an MRI apparatus and a scan time necessary to scan an object.

The method may further include generating an imaging description corresponding to the first MR image based on at least one description.

The imaging description may be included in a private tag region in the Digital Imaging and Communication in Medicine (DICOM) standard.

The method may include: disabling the resource saving mode; acquiring, based on the disabling of the resource saving mode, imaging data and the imaging description corresponding to the first MR image; and generating a second MR image based on the imaging data and the imaging description.

The at least one description may include a description from among information about execution of each imaging filter, information about an execution environment, information about whether a low-resolution image is supported, and information about whether the each imaging filter is executed during generation of the second MR image.

The at least one description may include information about whether the plurality of imaging filters are reconfigurable, and/or information about whether the plurality of imaging filters are executable in an offline environment.

The at least one description may include information about selecting at least one channel from a plurality of channels in a multi-channel radio frequency (RF) coil.

The at least one description may include resolution information regarding the first MR image.

The method may further include displaying a reduced version (in size and/or resolution) of the generated first MR image in which the reduced version of the image results in a power savings over generating of an image that does not account for power usage.

According to an aspect of another embodiment disclosed herein, an MRI apparatus includes: a system control unit that is configured to set a resource saving mode; and an image processor that is configured to acquire, based on the set resource saving mode, at least one description corresponding to a plurality of imaging filters, and to generate a first MR image based on the acquired at least one description.

The MRI apparatus may include a monitoring unit configured to monitor at least one of an amount of power consumption of the MRI apparatus and a scan time necessary to scan an object, wherein the system control unit sets the resource saving mode based on at least one of the amount of power consumption and the scan time received from the monitoring unit.

In addition, the image processor may generate an imaging description corresponding to the first MR image based on the at least one description.

The imaging description may also be included in a private tag region in accordance with the DICOM standard.

The system control unit may disable the resource saving mode, and the image processor may acquire, based on the disabling of the resource saving mode, imaging data and the imaging description corresponding to the first MR image and generate a second MR image based on the imaging data and the imaging description without using the resource saving mode.

The at least one description may include information from among information about execution of each imaging filter, information about an execution environment, information about whether a low-resolution image is supported, and information about whether the each imaging filter is re-executed during generation of the second MR image.

The at least one description may include information about whether the plurality of imaging filters are reconfigurable and/or information about whether the plurality of imaging filters are executable in an offline environment.

The at least one description may include information for selecting at least one channel from a plurality of channels in a multi-channel RF coil.

The at least one description may include resolution information of the first MR image.

The MRI apparatus may further include an output unit such as a display configured to display a reduced version of the generated first MR image.

BRIEF DESCRIPTION OF THE DRAWINGS

These and/or other aspects will better understood and more readily appreciated by a person of ordinary skill in the art from the following description of the exemplary embodiments, taken in conjunction with the accompanying drawings in which:

FIG. 6 is a flowchart of a method of generating a first MR image according to an embodiment of the present disclosure;

FIG. 7A, FIG. 7B and FIG. 7C illustrate an example of different views of a first MR image generated by an MRI apparatus according to an embodiment of the present disclosure;

FIG. 9A and FIG. 9B illustrate an example of different views of a second MR image generated by an MRI apparatus, according to an embodiment of the present disclosure;

DETAILED DESCRIPTION

Figure 1:
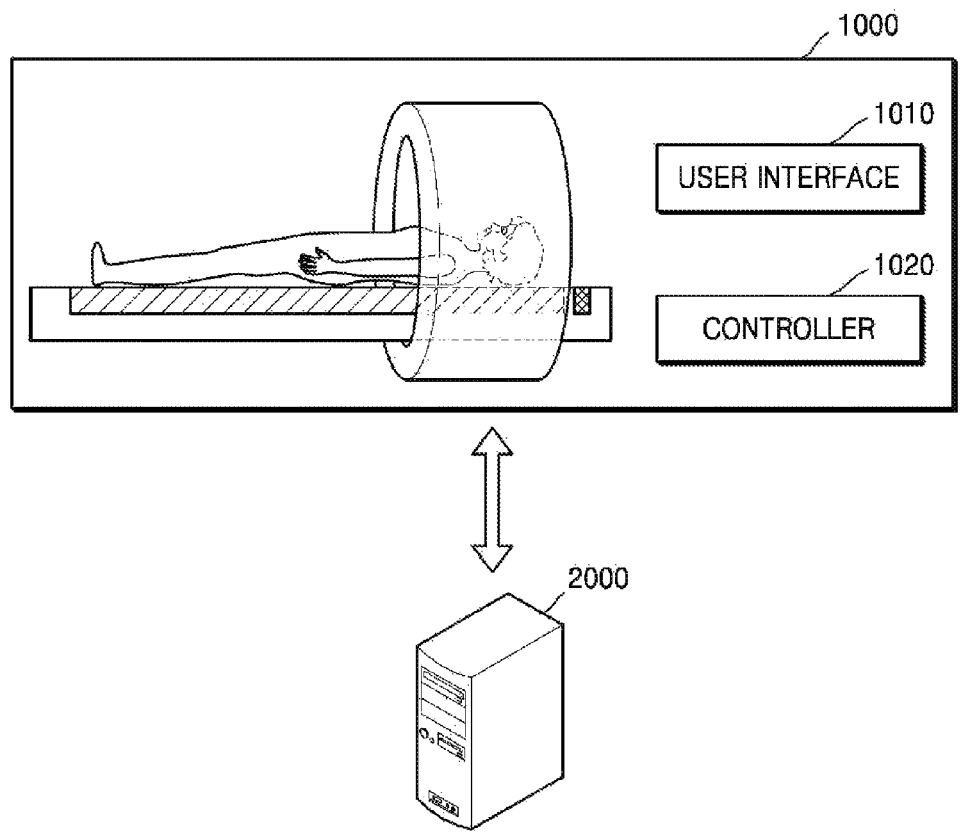
FIG. 1 is a schematic diagram of a magnetic resonance imaging (MRI) system according to an embodiment of the present disclosure.

Advantages and features of one or more embodiments of the present disclosure and methods of accomplishing the same may be understood more readily by reference to the following detailed description of the embodiments and the accompanying drawings. In this regard, the present embodiments may have different forms and should not be construed as being limited to the descriptions set forth herein. Rather, these embodiments are provided so that this disclosure will be thorough and complete and will fully convey the concept of the present embodiments to one of ordinary skill in the art, and the present disclosure will only be defined by the appended claims. In addition, unless otherwise stated to the contrary, constructions and operations from different embodiments are combinable and variations thereof still constitutes possession of the claimed invention for purposes of 35 U.S.C. §112, paragraph (a).

Terms used herein will now be briefly described and then one or more embodiments of the present disclosure will be described in more detail.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description of the disclosure. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the embodiments of the present disclosure refers to a component such as a field-programmable gate array (FPGA) or an application-specific integrated circuit (ASIC), and performs a specific function. The "unit" may be formed so as to be in an addressable storage medium, or may be formed so as to operate one or more processors. Thus, for example, the term "unit" is also a statutory element that is not software per se or pure software and may also include components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to embodiments of the present disclosure, examples of which are illustrated in the accompanying drawings. In the following description, well-known functions or constructions may be not described in detail so as not to obscure an artisan's appreciation of the disclosure with unnecessary detail about well-known functions or constructions. Expressions such as "at least one of," when preceding a list of elements, modify the entire list of elements and do not modify the individual elements of the list.

Furthermore, a "medical imaging apparatus" may include an X-ray apparatus, a computed tomography (CT) apparatus, a magnetic resonance imaging (MRI) apparatus, an ultrasound apparatus, and other medical imaging systems, but for convenience of explanation, it is assumed herein in the illustrated embodiments that the medical imaging apparatus is an MRI apparatus.

Furthermore, in the present specification, an "MR image" refers to an image of an object obtained by using the nuclear magnetic resonance principle.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, in the present specification, a "user" refers to an operator or manipulator, such as a radiographer, who operates an MRI apparatus, or a medical professional, such as a doctor, a nurse, and a medical laboratory technologist, but the user is not limited thereto.

An MRI system is an apparatus for acquiring a sectional image of a part of an object by expressing, in a contrast comparison, a strength of an MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics that may be different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

FIG. 1 is a schematic diagram of an MRI system according to an exemplary embodiment of the present disclosure. Referring now to FIG. 1, the MRI system according to the present exemplary embodiment may include an MRI apparatus 1000 and a storage apparatus 2000. Furthermore, the MRI apparatus 1000 may include a user interface 1010 and a controller 1020. The user interface and controller include hardware such as processors and/or microprocessors with circuitry configured for operation.

The controller 1020 of the MRI apparatus 1000 may set a resource saving mode to efficiently manage limited power and time in a hospital, etc. where a large number of examinees have to undergo examinations in a short amount of time. For the purposes of this disclosure and the appended claims the term resource saving mode is defined as a reduction in usage of resource (e.g., imaging filters) for generating a MR image.

Furthermore, the MRI modes of operation included off-mode, ready-to-scan mode, scan mode, service/diagnostic access model and standby. As disclosed by a publication entitled "Magnetic Resonance Measurement of Energy Consumption" by the Self-Regulatory Initiative for Medical Imaging Equipment, published March 2012 and copyright 2011 by the European Coordination Committee of the Radiological, Electromedical and Healthcare IT Industry) (hereafter "COCIR") discloses that anticipated power from higher to lower is Scanning—Ready-to-Scan-Service Diagnostic—Off.

In addition, the MRI apparatus 1000 may receive a user input for generating an MR image via the user interface 1010. For example, the MRI apparatus 1000 may receive a user input for generating an MR image showing blood flow in an object.

Furthermore, according to an exemplary embodiment, the controller 1020 of the MRI apparatus 1000 may generate a first MR image according to the received user input and being set in the resource saving mode.

The first MR image may be an MR image generated by the MRI apparatus 1000 using a minimum amount of resources. For example, the first MR image may be an image not showing blood flow despite the received user input.

The user may determine, based on the first MR image, whether an error has occurred during scanning of an object. For example, the user may check for errors, etc., due to motion of an examinee and capture an image of the object again.

Furthermore, the controller 1020 may transmit imaging data and an imaging description corresponding to the first MR image to the storage apparatus 2000. In this case, the imaging description may include information about resources used and not used when generating the first MR image. For example, the imaging description may include information used to generate the first MR image and information about resources necessary for showing blood flow.

Furthermore, the MRI apparatus 1000 may disable the set resource saving mode during pre-dawn hours when a power supply matches a power demand. In this case, the controller 1020 may generate a second MR image based on the imaging data and the imaging description corresponding to the first MR image received from the storage apparatus 2000.

The second MR image may be an MR image generated by the MRI apparatus 1000 according to an initial user input. For example, the second MR image may be an image representing a blood flow.

The user may perform image interpretation based on the second MR image. For example, the user may diagnose disease based on a blood flow shown in the second MR image.

In addition, although it has been described that the MRI apparatus 1000 generates the second MR image, exemplary embodiments are not limited thereto, According to an exemplary embodiment, an external device may receive imaging data and imaging description corresponding to the first MR image and generate the second MR image based on the received imaging data and imaging description.

Figure 2:
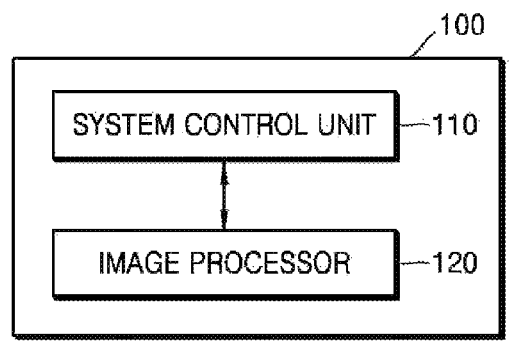
FIG. 2 is a block diagram of an MRI apparatus according to an embodiment of the present disclosure.

FIG. 2 is a block diagram of an MRI apparatus 100 according to an exemplary embodiment of the present disclosure.

Referring now to FIG. 2, the MRI apparatus 100 may include a system control unit 110 and an image processor 120. Furthermore, the MRI apparatus 100 may correspond to the MRI apparatus 1000 described with reference to FIG. 1, and the system control unit 110 and the image processor 120 may be included in the controller 1020 described with reference to FIG. 1.

The system control unit 110 may receive the amount of power consumption by the MRI apparatus 100 from a monitoring unit (not shown) in the MRI apparatus 100. The monitoring unit, which is not limited to the description disclosed in the publication referred to above by the COCIR, may comprise a calibrated power meter that can sample average power ratings, or may comprise a device that measure 3-phase voltage and current and calculates an integral of power with respect to time (energy).

Furthermore, the system control unit 110 may receive from a monitoring unit (not shown) the amount of power consumption in a region where the MRI apparatus 100 is located.

Furthermore, the system control unit 110 may predict a scan time necessary for scanning before actually scanning an object.

In addition, the system control unit 110 may set a resource saving mode according to the received amount of power consumption or predicted scan time. For example, if the received amount of power consumption or the predicted scan time exceeds a predetermined threshold value, the system control unit 110 may automatically set a resource saving mode for operation.

Alternatively, the system control unit 110 may set a resource saving mode based on a received user input.

As the resource saving mode is set, the system control unit 110 may generate a control signal and transmit the generated control signal to the image processor 120.

Furthermore, the system control unit 110 may disable the resource saving mode based on the received amount of power consumption or predicted scan time. For example, if the amount of power consumption received from the monitoring unit or the predicted scan time for a particular protocol or set of protocols is less than the predetermined threshold value, the system control unit 110 may automatically disable the resource saving mode.

Alternatively, the system control unit 110 may disable the resource saving mode based on a user input received by the MRI apparatus 110.

In addition, as the resource saving mode is disabled, the system control unit 110 may generate a control signal and transmit the generated control signal to the image processor 120, etc.

Figure 3:
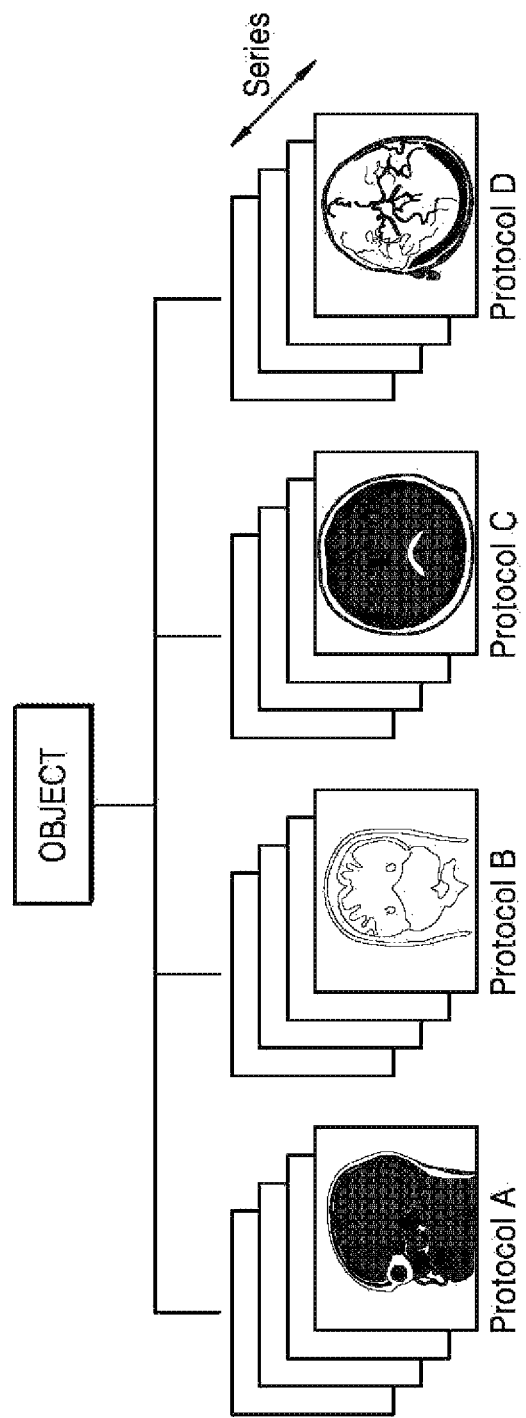
FIG. 3 illustrates structures of MR images according to an embodiment of the present disclosure.

FIG. 3 illustrates structures of MR images according to an exemplary embodiment.

Referring now to FIG. 3, the MRI apparatus 100 may scan an object by using at least one protocol. In this case, a protocol may be a technique for capturing and processing an image of an object via the MRI apparatus 100 of an MRI system. For example, if the object is a brain, the MRI apparatus 100 may use a plurality of protocols to scan the brain in order to generate a cerebrovascular image, a brain structure image, a brain disease image, a cerebral blood flow image, etc.

The MRI apparatus 100 may acquire a plurality of MR images by using a plurality of protocols, i.e., Protocol A, Protocol B, Protocol C, and Protocol D, for the same object and generate a series of MR images based on each of the plurality of protocols.

Referring back to FIG. 2, according to an exemplary embodiment, the image processor 120 may receive a control signal indicating that a resource saving mode has been set from the system control unit 110. The resource saving mode is defined as a reduction in usage of resource (e.g., imaging filters) for generating a MR image.

Furthermore, according to an exemplary embodiment, the image processor 120 may acquire a protocol description from storage corresponding to each protocol and a filter description corresponding to each imaging filter.

In this case, the protocol description may include information related to capturing of an image of an object. For example, the protocol description may include pulse sequence information and parameter information related to a pulse sequence, but is not limited thereto.

Furthermore, the protocol description may include information related to image processing. According to an exemplary embodiment, the information related to image processing may include information about identification values for at least one imaging filter and information about an address where a filter description corresponding to each imaging filter is located.

Furthermore, the protocol description may include information related to a resource saving mode. In addition, the protocol description may include information about whether at least one imaging filter is reconfigurable in a resource saving mode, information about whether imaging filters are executable in an offline environment, etc.

For example, a protocol description corresponding to Protocol A may include information indicating that a plurality of imaging filters (e.g., a filter, b filter, and c filter) are reconfigurable in a resource saving mode. In this case, the image processor 120 may generate a first MR image based on filter description information related to each of the plurality of imaging filters.

Furthermore, according to an exemplary embodiment, a protocol description may include information about selecting at least one channel from a plurality of channels in a multi-channel RF coil that acquires MR signals from an object. The image processor 120 may generate a first MR image based on data acquired from the selected channel whose information is contained in the protocol description.

Furthermore, the protocol description may include resolution information of a first MR image that is generated in a resource saving mode. For example, if a resource saving mode is set, the image processor 120 may generate a first MR image having a 50×50 resolution based on the protocol description.

According to an exemplary embodiment, a filter description may include information about each imaging filter and information related to a resource saving mode.

For example, a filter description may include information about an identification value of an imaging filter, a type of imaging filter, an environment (e.g., a central processing unit (CPU) or graphics processing unit (GPU)) where the imaging filter is executed, etc. The image processor 120 may identify whether an imaging filter is a reconstruction filter or a post-processing filter, based on information about the type of imaging filter contained in the filter description.

Furthermore, the filter description may include, but is not limited to, information about whether an imaging filter is executed in a resource saving mode, information about whether the imaging filter supports generation of a low-resolution image, and information about whether the imaging filter is re-executed when the resource saving mode is disabled.

For example, the image processor 120 may acquire information indicating that "b-filter" is not executed in a resource saving mode, based on filter descriptions respectively corresponding to a plurality of reconfigurable imaging filters (e.g., "a-filter", "b-filter", and "c-filter). In this case, the image processor 120 may generate a first MR image by executing a-filter and c-filter.

In addition, while it has been disclosed herein that a protocol description and a filter description are implemented as separate descriptions, exemplary embodiments are not limited thereto. For example, the protocol description and the filter description may be implemented as a single or plurality of descriptions.

Furthermore, the protocol description and the filter description may be implemented in an eXtensible Markup Language (XML), a Wireless Markup Language (WML), etc., just to name a few non-limiting possibilities.

According to an exemplary embodiment, the image processor 120 may transmit, based on the received control signal and acquired at least one description, a control signal for generating a first MR image to a plurality of imaging filters or other devices in the MRI apparatus 100.

Furthermore, the image processor 120 may generate an imaging description based on the acquired protocol description and filter description. In this case, the imaging description may include information about the protocol description and the filter description. For example, the imaging description may include information about imaging filters used and not used when generating the first MR image.

The generated imaging description may be stored in the storage apparatus disposed inside or outside the MRI apparatus 100, according to the Digital Imaging and Communication in Medicine (DICOM) standard.

Furthermore, the image processor 120 may receive a control signal indicating that the set resource saving mode has been disabled. The image processor 120 may acquire an imaging description corresponding to a first MR image from the storage apparatus 2000 disposed inside or outside the MRI apparatus 100. The image processor 120 may also generate a second MR image based on the acquired imaging description.

Furthermore, the image processor 120 may include a plurality of imaging filters.

In the image processor 120, the plurality of imaging filters may generate a first MR image based on data acquired from an object and a control signal generated by the image processor 120. Furthermore, the plurality of imaging filters may generate a second MR image based on imaging data acquired from the storage apparatus 2000 and a control signal generated by the image processor 120. The plurality of imaging filters in the image processor 120 will now be described in more detail with reference to FIG. 4.

Figure 4:
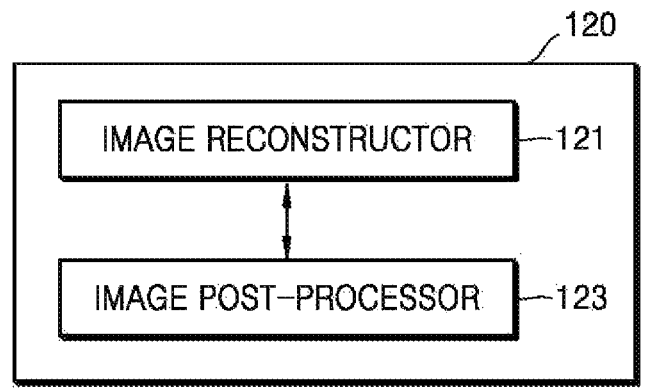
FIG. 4 is a block diagram of an image processor according to an embodiment of the present disclosure.

FIG. 4 is a block diagram of the image processor 120 according to an exemplary embodiment.

Referring now to FIG. 4, the image processor 120 may include an image reconstructor 121 and an image post-processor 123.

According to an exemplary embodiment, the image reconstructor 121 may be composed of a plurality of imaging filters for generating an MR image.

For example, the image reconstructor 121 may include at least one of: a filter for amplifying a specific frequency of data acquired from the object, a filter for aligning data to a K-space, a filter for converting frequency-domain data into spatial-domain data, a filter for calculating an average of data acquired from a plurality of channels in a multi-channel RF coil, a filter for reducing a deviation between signals in an image, a filter for storing imaging data in a database, and a filter for changing a sequence order of images.

Furthermore, each of the plurality of imaging filters in the image reconstructor 121 may be executed based on, for example, a control signal generated by the image processor 120 to generate an MR image. Furthermore, the plurality of imaging filters may be executed sequentially or in parallel.

According to an exemplary embodiment, the image post-processor 123 may receive an MR image generated by the image reconstructor 121. Furthermore, the image post-processor 123 may receive a series of MR images generated by the image reconstructor 121. The image post-processor 123 may be composed of a plurality of hardware or software filters for performing additional image processing on the received MR images.

For example, the image post-processor 123 may include various filters which perform a comparison or an analysis between images in order to determine a direction of blood flow, a velocity of blood flow, a change in tissue, or the like.

Furthermore, each of the plurality of filters in the image post-processor 123 may be executed based on a control signal generated by the image processor 120 to generate an MR image. Furthermore, the plurality of imaging filters may be executed sequentially or in parallel.

MR images that are generated by the image reconstructor 121 and the image post-processor 123 may be first or second MR images.

Figure 5A:
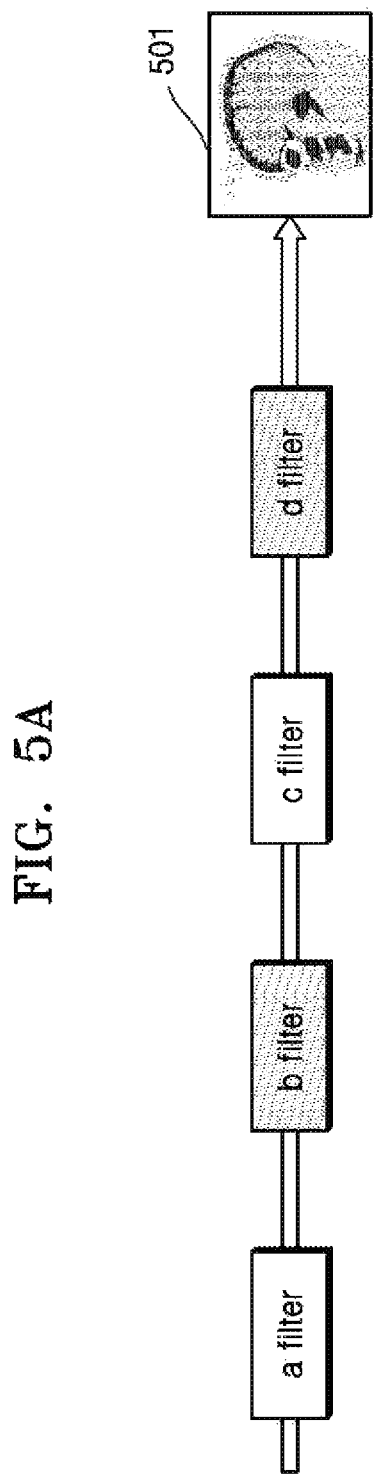
FIG. 5A and FIG. 5B illustrate an example where an image processor generates respective first and second MR images, according to an exemplary embodiment of the present disclosure.
Figure 5B:
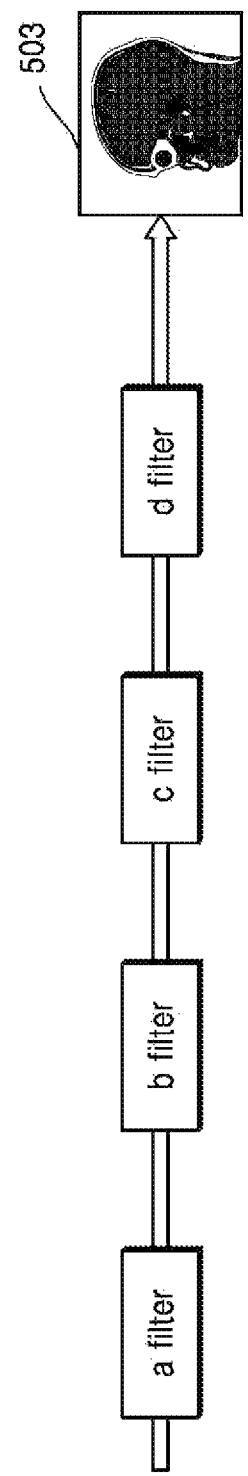

FIGS. 5A and 5B illustrate respective examples where the image processor 120 generates first and second MR images, according to an exemplary embodiment.

As shown in FIGS. 5A and 5B, the MRI apparatus 100 may generate an image by photographing an object based on Protocol A shown in FIG. 3.

In this case, Protocol A may be a scanning and image processing technique for generating a MR image of a brain tissue in an object.

For example, the image processor 120 may acquire a protocol description corresponding to Protocol A. The protocol description may include information for generating a first MR image having a 50×50 resolution in a resource saving mode and information indicating that a plurality of imaging filters are reconfigurable.

Furthermore, the protocol description may include information about addresses where filter descriptions respectively corresponding to a plurality of imaging filters, i.e., "a-filter", "b-filter", and "c-filter" that are reconstruction filters, and "d-filter" that is a post-processing filter are located.

Furthermore, the image processor 120 may acquire, based on the filter descriptions, information indicating that b-filter may generate a low resolution image from among the plurality of imaging filters (a-filter, b-filter, c-filter, and d-filter) and that d-filter is not executed in a resource saving mode.

When the image processor 120 receives a control signal indicating that a resource saving mode has been set from the system control unit 110, the image processor 120 may generate a control signal based on information acquired from a protocol description and a filter description. The image processor 120 may transmit the generated control signal to a-filter, b-filter, and c-filter of the reconstruction filter 121.

For example, the image reconstructor 121 may generate a first MR image having a 50×50 resolution based on the received control signal.

Thereafter, the image processor 120 may receive a control signal indicating that the set resource saving mode has been disabled from the system control unit 110. Furthermore, the image processor 120 may acquire an imaging description corresponding to the first MR image 501 from the storage apparatus 2000.

For example, the imaging description may include information about a-filter, b-filter, and c-filter used when generating the first MR image 501 and d filter that is not used when generating the first MR image 501.

The image processor 120 may transmit a control signal generated according to information acquired from the imaging description to imaging filters in the image reconstructor 121 and the image post-processor 123.

As shown in FIG. 5B, the image reconstructor 121 and the image post-processor 123 may generate the second MR image 503 by executing a-filter, b-filter, c-filter, and d-filter sequentially, based on the received control signal.

FIG. 6 is a flowchart illustrating an operative example of a method of generating a first MR image according to an exemplary embodiment of the present disclosure.

Referring now to FIG. 6, the MRI apparatus 100 may set a resource saving mode (S110) that will decrease the energy expended to scan according to certain protocols.

The MRI apparatus 100 may set a resource saving mode based on the amount of power consumption of the MRI apparatus 100. For example, if the operation mode of the MRI apparatus 100 is low-power mode, the MRI apparatus 100 may set the resource saving mode. Alternatively, if the amount of power consumption in the MRI apparatus 100 exceeds a predetermined threshold value, the MRI apparatus 100 may set a resource saving mode. The predetermined threshold value could be varies based on the capacity or efficiency of the MRI apparatus 100. Furthermore, the predetermined threshold value may be stored in the MRI apparatus 100.

Furthermore, the MRI apparatus 100 may set a resource saving mode based on the amount of power consumption in a region where the MRI apparatus 100 is located.

For example, if the amount of power consumption in a building where the MRI apparatus 100 is located exceeds a predetermined threshold value, the MRI apparatus 100 may automatically set a resource saving mode.

Furthermore, the MRI apparatus 100 may predict a scan time necessary to scan an object. The MRI apparatus 100 may set a resource saving mode based on the predicted scan time. For example, if the predicted scan time exceeds a predetermined value, the MRI apparatus may set a resource saving mode to reduce an overall amount of power expended to perform the scan.

In addition, the MRI apparatus 100 may set a resource saving mode in response to a user input received by the MRI apparatus 100.

The MRI apparatus 100 may acquire at least one description corresponding to a plurality of imaging filters, based on the set resource saving mode (S120).

The MRI apparatus 100 may scan an object by using at least one protocol recommended to scan the particular object, and generate at least one MR image. In this case, a protocol may be a technique for capturing and processing an image of an object via the MRI apparatus 100 of an MRI system, etc. For example, when the object is a lung, there are typically recommended protocols that are different from another object.

Furthermore, the MRI apparatus 100 may acquire a protocol description corresponding to each protocol and filter descriptions corresponding to a plurality of imaging filters that are executed according to each protocol.

The protocol description may include information related to capturing an image of an object. For example, the protocol description may include parameters such as repetition time (TR), a flip angle schedule, echo time (TE), etc.

Furthermore, the protocol description may include information related to image processing. The information related to image processing may include information about identification values for at least one imaging filter and information about an address where a filter description corresponding to each imaging filter is located.

Furthermore, the protocol description may include information related to a resource saving mode. For example, when the resource saving mode is set, the protocol description may include information about whether a plurality of imaging filters executed according to a predetermined protocol are reconfigurable, information about whether the plurality of imaging filters are executable in an offline environment, etc.

For example, if a plurality of imaging filters executed according to a predetermined protocol are reconfigurable, the MRI apparatus 100 may not execute some of the plurality of imaging filters. Furthermore, if the imaging filters are reconfigurable, the MRI apparatus 100 may execute the imaging filters by modifying functions of some of the imaging filters. In addition, the MRI apparatus 100 may acquire information about some of the imaging filters not executed and modified functions of some of the imaging filters from filter descriptions respectively corresponding to the imaging filters.

Moreover, if a plurality of imaging filters executed according to a predetermined protocol is executed in an offline environment, the MRI apparatus 100 may generate an MR image while wired and wireless communications with an external device are blocked.

In addition, the protocol description may include information about selecting at least one channel from a plurality of channels in a multi-channel RF coil that acquires MR signals from an object.

Furthermore, the protocol description may include resolution information of a first MR image that is generated in a resource saving mode.

According to an exemplary embodiment, the filter description may include information about each imaging filter and information related to operating in a resource saving mode.

For example, a filter description may include information about an identification value of an imaging filter, a type of imaging filter, an environment (e.g., a CPU or GPU) where the imaging filter is executed, etc.

Furthermore, the filter description may include, but is not limited to, information about whether an imaging filter is executed in a resource saving mode, information about whether the imaging filter supports generation of a low-resolution image, and information about whether the imaging filter is executed when the resource saving mode is disabled. In this case, the information about whether the imaging filter supports generation of a low-resolution image may be information about whether each imaging filter is able to generate a low-resolution MR image by modifying some functions. Such information can be used to determine a resource saving mode series of protocols.

As the resource saving mode has been set, the MRI apparatus 100 may acquire information corresponding to the resource saving mode from at least one description related to the plurality of imaging filters.

In addition, while it has been disclosed herein that a protocol description and a filter description are implemented as separate descriptions, embodiments are not limited thereto. For example, the protocol description and the filter description may be implemented as a single or plurality of descriptions according to the characteristics of each protocol.

Finally, with reference again to FIG. 6, the MRI apparatus 100 may generate a first MR image based on the acquired at least one description (S130).

When the MRI apparatus 100 acquires information for selecting at least one channel from a plurality of channels in a multi-channel RF coil, the MRI apparatus 100 may generate a first MR image by using only data acquired from a selected channel.

Furthermore, when the MRI apparatus 100 acquires information indicating that a plurality of imaging filters are reconfigurable, the MRI apparatus 100 may generate a first MR image by using different quantities of the plurality imaging filters, meaning that at least one or more imaging filters are not used. In addition, the MRI apparatus 100 may generate a first MR image having a low resolution based on resolution information acquired from the at least one description.

Figure 7A:
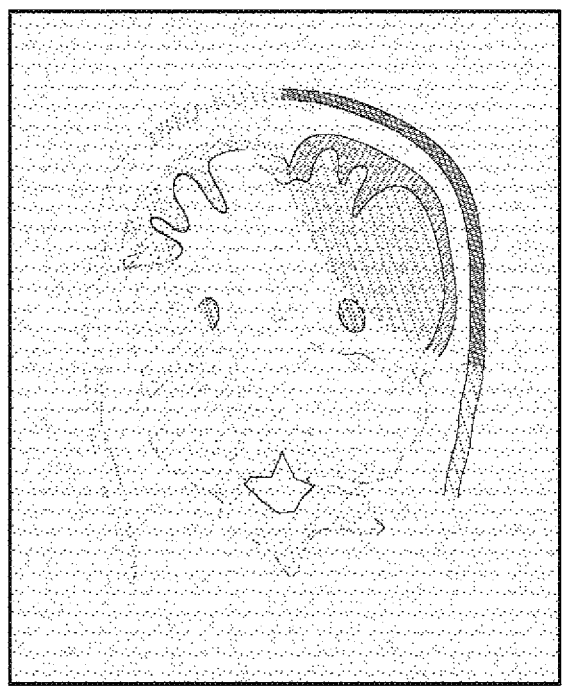
Figure 7B:
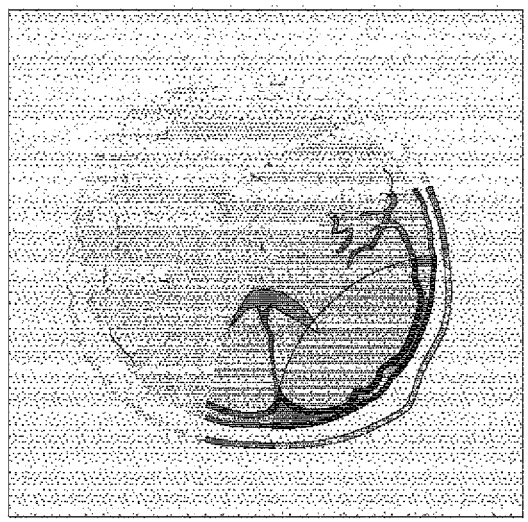

FIGS. 7A, 7B and 7C illustrate an example of a first MR image generated by the MRI apparatus 100 according to an exemplary embodiment.

As shown in FIGS. 7A and 7B, the MRI apparatus 100 may generate a first MR image based on data acquired from at least one channel in a multi-channel RF coil.

Furthermore, as shown in FIG. 7C, the MRI apparatus 100 may generate a first MR image 700-3 by not using an image distortion correction filter during merging of MR images 700-1 and 700-2. In other words, only using some filters, and not using other filters may have a significant impact on the MR image.

Figure 8:
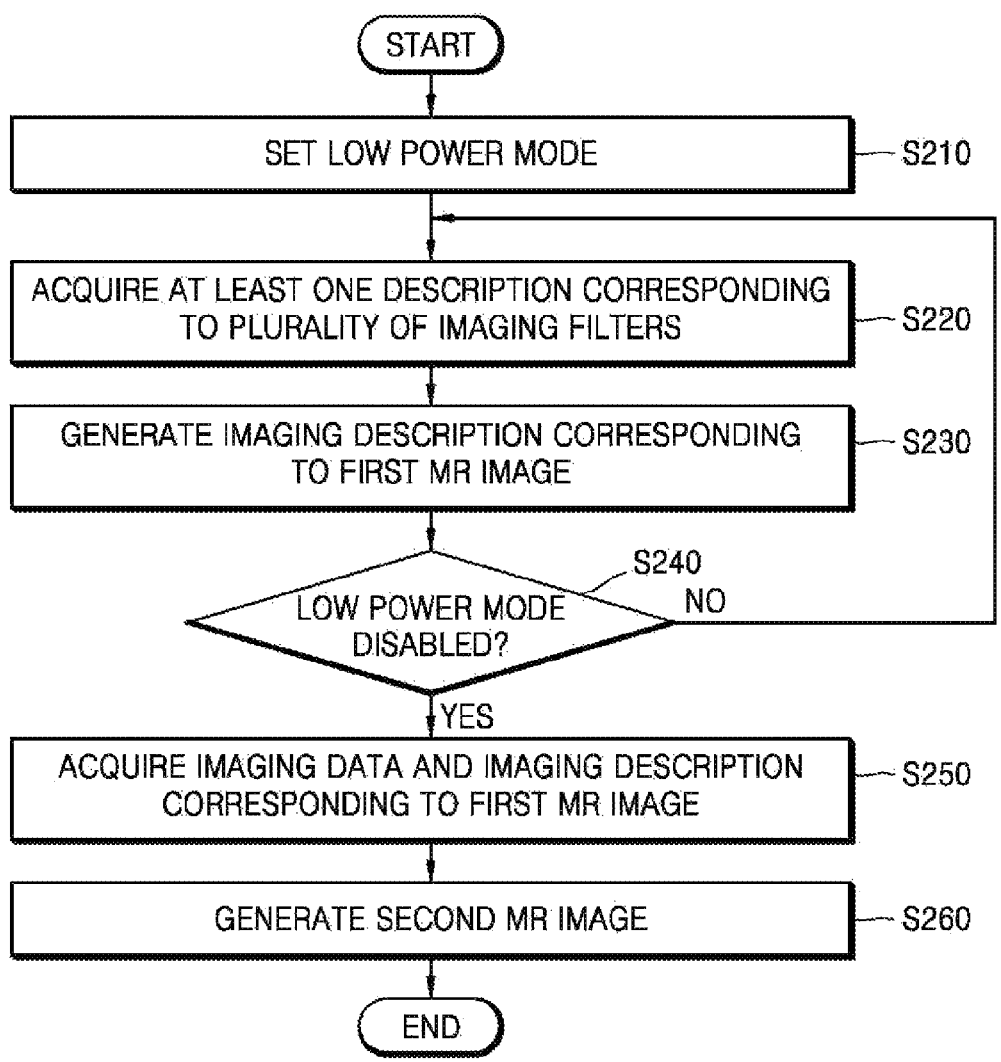
FIG. 8 is a flowchart of a method, performed by an MRI apparatus, of generating a second MR image, according to an embodiment of the present disclosure.

FIG. 8 is a flowchart providing an operative example of a method, performed by the MRI apparatus 100, of generating a second MR image, according to an embodiment of the disclosure.

Referring now to FIG. 8, at (S210), the MRI apparatus 100 may set a resource saving mode. Then, at (S220), the MRI apparatus 100 may acquire at least one description corresponding to a plurality of imaging filters, based on the set resource saving mode. Since operations S210 and S220 respectively correspond to operations S110 and S120 described with reference to FIG. 6, detailed descriptions thereof will be omitted below.

At (S230), the MRI apparatus 100 may generate an imaging description corresponding to the first MR image.

The imaging description may include information about the impact of both imaging filters used when generating the first MR image and information about the impact on the first MR image when certain imaging filters are not used when generating the first MR image.

Furthermore, the imaging description may include information about addresses in storage where a protocol description and filter descriptions corresponding to the first MR image are located.

In addition, the generated imaging description may be transmitted to the storage apparatus 2000 disposed inside or outside the MRI apparatus 100, according to the DICOM standard. For example, the imaging description may be included in a private tag in the DICOM standard.

At (S240), the MRI apparatus 100 may disable the set resource saving mode.

When the amount of power consumption by the MRI apparatus 100 or in a region where the MRI apparatus 100 is located is less than or equal to a predetermined threshold value, the MRI apparatus 100 may automatically disable the set resource saving mode. The reasons for automatic disablement of the resource saving mode may include that the images in the resource saving mode may not be of similar quality than images obtained when there is higher or normal usage of power.

Furthermore, the MRI apparatus 100 may disable the set resource saving mode based on a received user input.

When the set resource saving mode is disabled, at (S250) the MRI apparatus 100 may acquire imaging data corresponding to the first MR image and an imaging description corresponding to the first MR image from the storage apparatus 2000.

At (S260), the MRI apparatus 100 may generate a second MR image based on the acquired imaging data and imaging description.

The MRI apparatus 100 may acquire a protocol description and filter descriptions based on the acquired imaging description. In this case, the MRI apparatus 100 may generate a second MR image based on the protocol description and the filter descriptions.

Furthermore, the MRI apparatus 100 may acquire information about a plurality of imaging filters based on the imaging description. In this case, the MRI apparatus 100 may generate a second MR image based on the acquired information and imaging data.

FIGS. 9A and 9B illustrate an example of a second MR image generated by the MRI apparatus 100, according to an exemplary embodiment As shown in FIG. 9A, as a resource saving mode has been disabled, the MRI apparatus 100 may generate a second MR image based on imaging data corresponding to a first MR image.

Furthermore, as shown in FIG. 9B, the MRI apparatus 100 may generate a second MR image by executing an image distortion correction filter that was not used when generating the first MR image.

Figure 10:
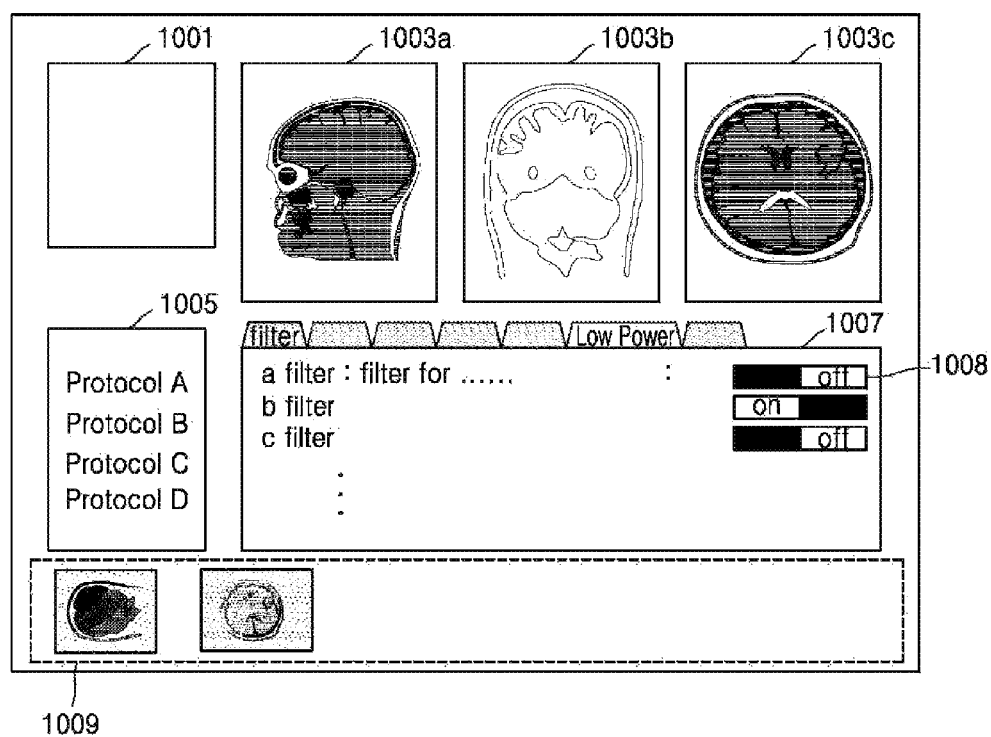
FIG. 10 is an example of a user interface screen on an MRI apparatus, which displays a first MR image, according to an embodiment pf to the present disclosure.

FIG. 10 is an example of a user interface screen on the MRI apparatus 100, which displays a first MR image, according to an exemplary embodiment.

Referring now to FIG. 10, the user interface screen on the MRI apparatus 100 may include a live view region 1001, localized regions 1003a, 1003b, and 1003c, a protocol selection region 1005, a parameter setting region 1007, and a reduced version image region 1009.

Furthermore, the user interface screen may be displayed on the MRI apparatus 100.

A live view image may be displayed in the live view region 1001 during capturing of an image of an object. On the other hand, when a resource saving mode is set, the MRI apparatus 100 may not provide a live view image.

Scout images with respect to a first MR image may be displayed in the localized regions 1003a through 1003c. Furthermore, the scout images may be of cross-sections in three directions corresponding to a sagittal view, a coronal view, and an axial view. The user may receive a user input for selecting locations, sizes, directions, etc. of slices in a scout image. Furthermore, the user may select a slice and a protocol for scanning based on a scout image.

A scout image may also be referred to as an exam image, an exam view, a planning image, or a planning view.

In the protocol selection region 1005, at least one protocol that may be selected by the user may be displayed, and a user interface configured to receive a user input for selecting a protocol may be provided. A protocol may be a scanning and image processing technique used by the MRI apparatus 100.

A user interface for setting parameters related to scanning of an object and parameters related to image processing may be provided in the parameter setting region 1007.

For example, a user interface for setting parameters such as repetition time (TR), slice thickness, and the number of a series of images may be provided in the parameter setting region 1007.

Furthermore, a user interface 1008 for determining whether a plurality of imaging filters are executable in a resource saving mode may be provided in the parameter setting region 1007.

Based on a user input received from the protocol selection region 1005 and the parameter setting region 1007, the MRI apparatus 100 may generate a protocol description and filter descriptions and update the protocol description and the filter descriptions.

A reduced version of the generated first MR image may be displayed in the reduced version image region 1009.

Figure 11:
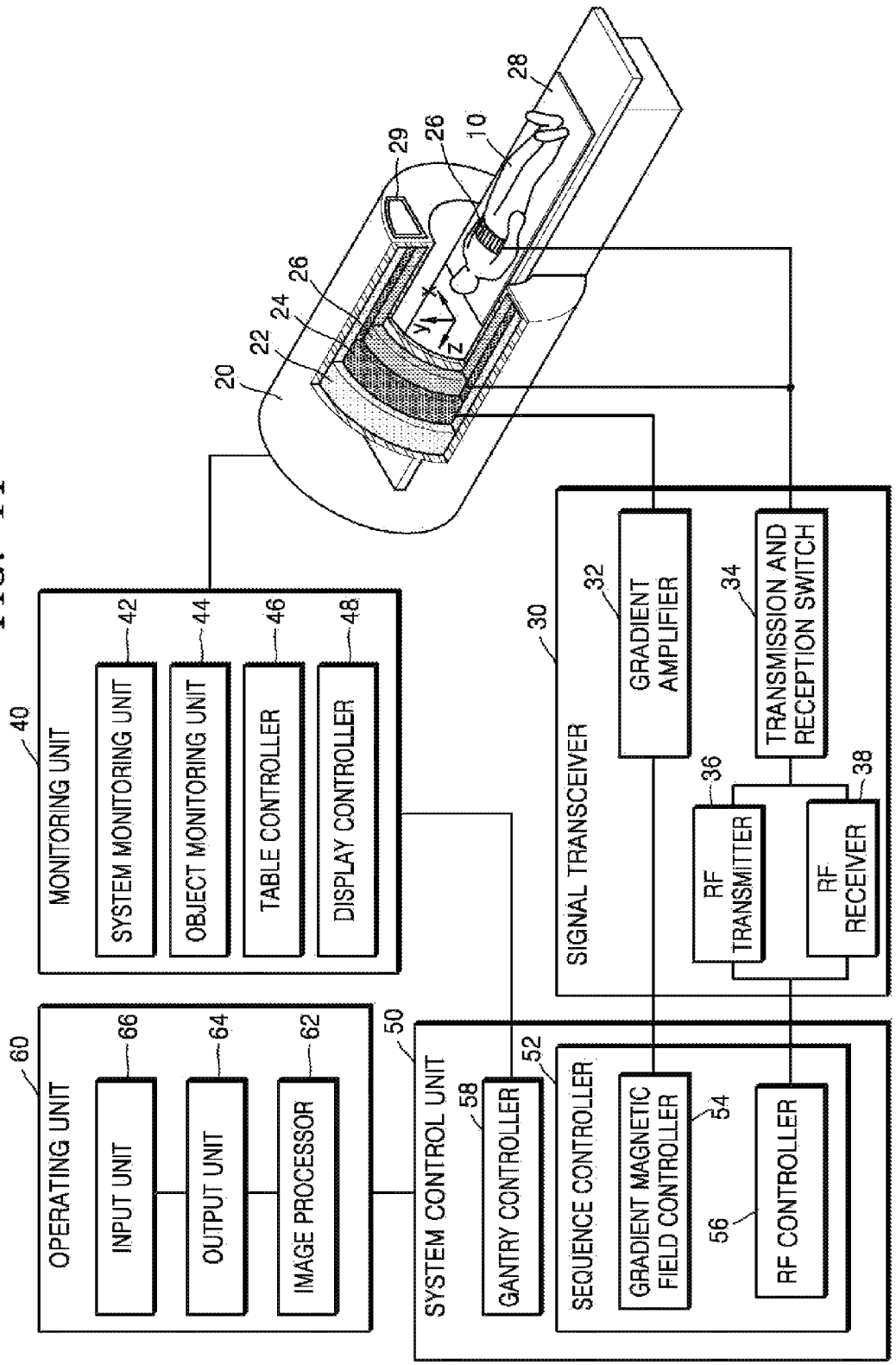
FIG. 11 is a detailed block diagram of a configuration of an MRI apparatus according to an embodiment of the present disclosure.

FIG. 11 is a detailed block diagram of a configuration of an MRI apparatus 1100 according to an exemplary embodiment.

Referring to FIG. 11, the MRI apparatus 1100 according to the present exemplary embodiment may include a gantry 20, a signal transceiver 30, a monitoring unit 40, a system control unit 50, and an operating unit 60. Furthermore, the system control unit 50 may correspond to the system control unit 110 described with reference to FIG. 2.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit 42, an object monitoring unit 44, a table controller 46, and a power monitoring unit 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The power monitoring unit 48 may monitor the amount of power consumption.

Furthermore, the power monitoring unit 48 may monitor the amount of power consumption of the MRI apparatus 1100.

Furthermore, the power monitoring unit 48 may monitor the amount of power consumption in a region where the MRI apparatus 1100 is located. For example, the power monitoring unit 48 may acquire the amount of power consumption in a building where the MRI apparatus 1100 is located Furthermore, the power monitoring unit 48 may transmit the monitored amount of power consumption at regular time intervals. In addition, when the monitored amount of power consumption is greater than or less than a predetermined threshold value, the power monitoring unit 48 may transmit the amount of power consumption to the system control unit 50.

The system control unit 50 may set a resource saving mode based on the amount of power consumption received from the power monitoring unit 48 and disable the set resource saving mode. Since the system control unit 50 corresponds to the system control unit 110 described with reference to FIG. 2, a detailed description thereof will be omitted below.

The system control unit 50 may transmit a control signal, which is generated when the resource saving mode is set or disabled, to the operating unit 60.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit 64, and an input unit 66.

Furthermore, the image processor 62 may receive data from the RF receiver 38 or the storage apparatus 2000 and perform various signal processes, such as amplification, frequency transformation, phase detection, low frequency amplification, and filtering, on the received data.

For example, the image processor 62 may generate a first or second MR image by executing a filter for arranging digital data in a k space (e.g., also referred to as a Fourier space or a frequency space) of a memory, a filter for performing 2D or 3D Fourier transformation on the digital data, etc.

The image processor 62 may perform a post-processing filter, such as a composition process or a difference calculation process on the image data if required. The composition process may include an addition process on a pixel or a maximum intensity projection (MIP) process.

The image processor 62 may perform any of the signal processes on the MR signal sequentially or in parallel. For example, the image processor 62 may perform a signal process on a plurality of MR signals received by a multi-channel RF coil in parallel so as to rearrange the plurality of MR signals into image data.

In addition, since the image processor 62 corresponds to the image processor 120 described with reference to FIG. 2, a detailed description thereof will be omitted below.

The output unit 64 may output a first or second MR image generated by the image processor 62 to the user.

The output unit 64 may also output information required for the user to manipulate the MRI system, such as a user interface (UI), user information, or object information.

The output unit 64 may be one or more of a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input unit 66.

The input unit 66 may transmit information acquired based on a user input to the image processor 62 or the system control unit 50.

Figure 12:
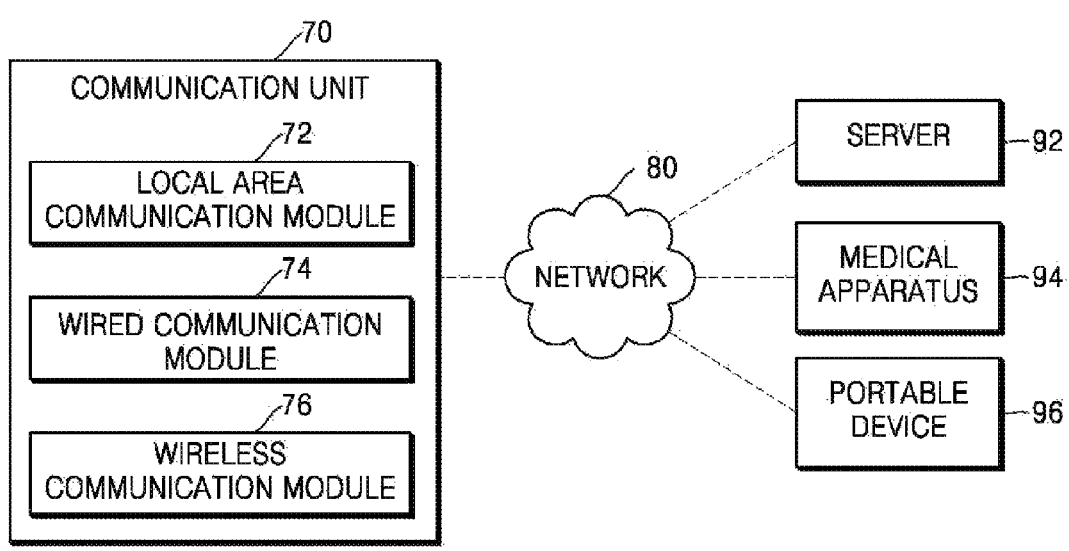
FIG. 12 illustrates a configuration of a communication unit according to an embodiment of the present disclosure.

FIG. 12 illustrates a configuration of a communication unit 70 according to an exemplary embodiment.

Referring to FIG. 12, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a storage apparatus, a hospital server, or another medical apparatus in a hospital, which is connected through a picture archiving and communication system (PACS), and perform data communication according to the DICOM standard.

As shown in FIG. 10, the communication unit 70 may be coupled to a network 80 by wire or wirelessly to communicate with a storage apparatus 92, a medical apparatus 94, or a portable device 96.

According to an exemplary embodiment, the MRI apparatus 1100 may exchange via the communication unit 70 imaging data and imaging description corresponding to a first MR image with the storage apparatus 92 disposed outside the MRI apparatus 1100. For example, the communication unit 70 may exchange information about imaging description with the storage apparatus 92 via a private tag region in the DICOM standard.

Furthermore, the communication unit 70 may transmit or receive, via the network 80, data related to diagnosis of an object, as well as imaging data corresponding to a first MR image captured by another medical apparatus 94 such as a CT system, an MRI system, or an X-ray system and an imaging description corresponding to the first MR image.

The embodiments of the inventive concept may be written as computer programs and may be implemented in general-use digital computers that execute the programs using a non-transitory computer-readable recording medium, but none of the embodiments are software per se.

Examples of the non-transitory computer-readable recording medium include magnetic storage media (e.g., ROM, floppy disks, hard disks, etc.), optical recording media (e.g., CD-ROMs or DVDs), etc.

The apparatuses and methods of the disclosure can be implemented in hardware, and in part as firmware or via the execution of software or computer code in conjunction with hardware that is stored on a non-transitory machine readable medium such as a CD ROM, a RAM, a floppy disk, a hard disk, or a magneto-optical disk, or computer code downloaded over a network originally stored on a remote recording medium or a non-transitory machine readable medium and stored on a local non-transitory recording medium for execution by hardware such as a processor, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc., that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor", "microprocessor" "controller", or "control unit" constitute hardware in the claimed disclosure that contain circuitry that is configured for operation. Under the broadest reasonable interpretation, the appended claims constitute statutory subject matter in compliance with 35 U.S.C. §101 and none of the elements are software per se. No claim element herein is to be construed under the provisions of 35 U.S.C. 112, sixth paragraph, unless the element is expressly recited using the phrase "means for".

The definition of the terms "unit" or "module" as referred to herein are to be understood as constituting hardware circuitry such as a CCD, CMOS, SoC, AISC, FPGA, at least one processor or microprocessor (a controller or control unit) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. §101 and do not constitute software per se. For example, the image processor in the present disclosure, and any references to an input unit and/or an output unit both comprise hardware circuitry configured for operation.

While the present inventive concept has been particularly shown and described with reference to exemplary embodiments thereof, it will be understood by those of ordinary skill in the art that various changes in form and details may be made therein without departing from the spirit and scope of the inventive concept as defined by the following claims. Accordingly, the above embodiments and all aspects thereof are examples only and are not limiting.

What is claimed is:

1. A method of generating a magnetic resonance (MR) image, the method comprising:
   setting, by a system controller, a resource saving mode;
   acquiring, by an image processor, based on the set resource saving mode, at least one description corresponding to operation of a plurality of imaging filters; and
   generating a first MR image in the resource saving mode based on the acquired at least one description.

2. The method of claim 1, wherein the setting of the resource saving mode comprises setting the resource saving mode based on at least one of an amount of power consumption of a magnetic resonance imaging (MRI) apparatus and a scan time necessary to scan an object.

3. The method of claim 2, wherein the amount of power consumption of the MRI apparatus is measured by a monitoring unit and compared with a predetermined threshold power usage value.

4. The method of claim 2, where the system controller compares a predetermined threshold power usage value and an estimated power usage for scanning the object and sets the resource saving mode when the estimate power usage exceeds the predetermined threshold power usage value or the scan time.

5. The method of claim 1, further comprising generating an imaging description corresponding to the first MR image based on the at least one description corresponding to operation of the plurality of imaging filters.

6. The method of claim 5, wherein the imaging description is included in a private tag region in accordance with a Digital Imaging and Communication in Medicine (DICOM) standard.

7. The method of claim 5, further comprising:
   disabling, by the system controller, the resource saving mode;
   acquiring, by the image processor, based on the disabling of the resource saving mode, imaging data and the imaging description corresponding to the first MR image; and
   generating a second MR image based on the imaging data and the imaging description.

8. The method according to claim 7, wherein the second MR image has at least one of a greater resolution or a great size than the first MR image.

9. The method of claim 7, wherein the at least one description comprises at least one of: information about execution of each imaging filter, information about an execution environment, information about whether a low-resolution image is supported, and information about whether each imaging filter is executed during generation of the second MR image.

10. The method of claim 1, wherein the at least one description comprises at least one of information about whether the plurality of imaging filters are reconfigurable and information about whether the plurality of imaging filters are executable in an offline environment.

11. The method of claim 1, wherein the at least one description comprises information about selecting at least one channel from among a plurality of channels in a multi-channel radio frequency (RF) coil.

12. The method of claim 1, wherein the at least one description comprises resolution information of the first MR image.

13. The method of claim 1, further comprising displaying a reduced version of the generated first MR image, in which the first MR image is reduced in at least one of resolution or size than an image generated when resource saving mode is disabled.

14. A magnetic resonance imaging (MRI) apparatus comprising:
a system controller configured to set a resource saving mode; and
an image processor configured to acquire, based on the set resource saving mode, at least one description corresponding to operation of a plurality of imaging filters and generate a first MR image based on the acquired at least one description.

15. The MRI apparatus of claim 14, further comprising a monitoring unit configured to monitor at least one of an amount of power consumption of the MRI apparatus and a scan time to scan an object,
wherein the system controller sets the resource saving mode based on at least one of the amount of power consumption and the scan time received from the monitoring unit.

16. The MRI apparatus of claim 15, wherein the amount of power consumption measured by the monitoring unit is compared with a predetermined threshold power usage value, and lower power mode is set when the predetermined threshold power value is exceeded.

17. The MRI apparatus of claim 14, wherein the image processor generates an imaging description corresponding to the first MR image based on the at least one description.

18. The MRI apparatus of claim 17, wherein the imaging description is included in a private tag region according to a Digital Imaging and Communication in Medicine (DICOM) standard.

19. The MRI apparatus of claim 17, wherein the system controller disables the resource saving mode, and wherein the image processor acquires, based on the disabling of the resource saving mode, imaging data and the imaging description corresponding to the first MR image and generates a second MR image based on the imaging data and the imaging description in which the second MR image has at least one of greater resolution and a greater size than the first MR image.

20. The MRI apparatus of claim 19, wherein the at least one description comprises at least one of: information about execution of each imaging filter, information about an execution environment, information about whether a low-resolution image is supported, and information about whether each imaging filter is re-executed during generation of the second MR image.

21. The MRI apparatus of claim 14, wherein the at least one description comprises at least one of: information about whether the plurality of imaging filters are reconfigurable and information about whether the plurality of imaging filters are executable in an offline environment.

22. The MRI apparatus of claim 14, wherein the at least one description comprises information for selecting at least one channel from a plurality of channels in a multi-channel radio frequency (RF) coil.

23. The MRI apparatus of claim 14, wherein the at least one description comprises resolution information of the first MR image.

24. The MRI apparatus of claim 14, further comprising an output unit configured to display a reduced version of the generated first MR image that is reduced in at least one of resolution or size than an image generated when resource saving mode is disabled.

25. The MRI apparatus of claim 14, wherein a quantity of the plurality of imaging filters operated in the resource saving mode is less than when the resource saving mode is disabled.

26. A non-transitory computer-readable recording medium having recorded thereon a program for performing the method of claim 1 on a computer.

* * * * *